(12) United States Patent
Yoon

(10) Patent No.: US 8,120,186 B2
(45) Date of Patent: Feb. 21, 2012

(54) INTEGRATED CIRCUIT AND METHOD

(75) Inventor: Kimyung Yoon, Dresden (DE)

(73) Assignee: Qimonda AG, Munich (DE)

(*) Notice: Subject to any disclaimer, the term of this patent is extended or adjusted under 35 U.S.C. 154(b) by 441 days.

(21) Appl. No.: 12/032,315

(22) Filed: Feb. 15, 2008

(65) Prior Publication Data
US 2009/0206461 A1 Aug. 20, 2009

(51) Int. Cl.
*H01L 41/083* (2006.01)
(52) U.S. Cl. . 257/777; 257/686; 257/687; 257/E25.006; 257/E25.013
(58) Field of Classification Search .......... 257/685, 257/686, 777, E26.006, E25.013, E25.018, 257/E25.021, E25.027, E23.085, 687; 438/106, 438/118, 127
See application file for complete search history.

(56) References Cited

U.S. PATENT DOCUMENTS

| 6,291,259 | B1 | 9/2001 | Chun |
| 6,522,015 | B1* | 2/2003 | Glenn et al. ............. 257/777 |
| 7,185,426 | B1* | 3/2007 | Hiner et al. ............. 29/841 |
| 7,550,857 | B1* | 6/2009 | Longo et al. ............. 257/777 |
| 2003/0042591 | A1* | 3/2003 | Goller et al. ............. 257/686 |
| 2003/0057539 | A1* | 3/2003 | Koopmans ............. 257/686 |
| 2004/0099884 | A1* | 5/2004 | Fulcher ............. 257/207 |
| 2008/0001271 | A1* | 1/2008 | Marcinkiewicz ............. 257/678 |
| 2008/0012110 | A1* | 1/2008 | Chong et al. ............. 257/686 |
| 2008/0136003 | A1* | 6/2008 | Pendse ............. 257/686 |

FOREIGN PATENT DOCUMENTS
DE 19845316 12/1999
* cited by examiner

*Primary Examiner* — Cuong Q Nguyen
*Assistant Examiner* — Yosef Gebreyesus
(74) *Attorney, Agent, or Firm* — Dicke, Billig & Czaja, PLLC

(57) ABSTRACT

An integrated circuit and method of fabricating an integrated circuit. One embodiment includes a circuit chip, a contact pad, and a projecting top contact. A signal line couples the contact pad to the projecting top contact, the contact pad, the projecting top contact. The signal line is arranged on a top face of the circuit chip. A substrate and a lower contact pad, the lower contact pad is arranged on a bottom face of the substrate and the circuit chip is arranged on a top face of the substrate. A bottom face of the circuit chip is facing the top face of the substrate. A connection couples the contact pad on the circuit chip to the lower contact pad.

21 Claims, 9 Drawing Sheets

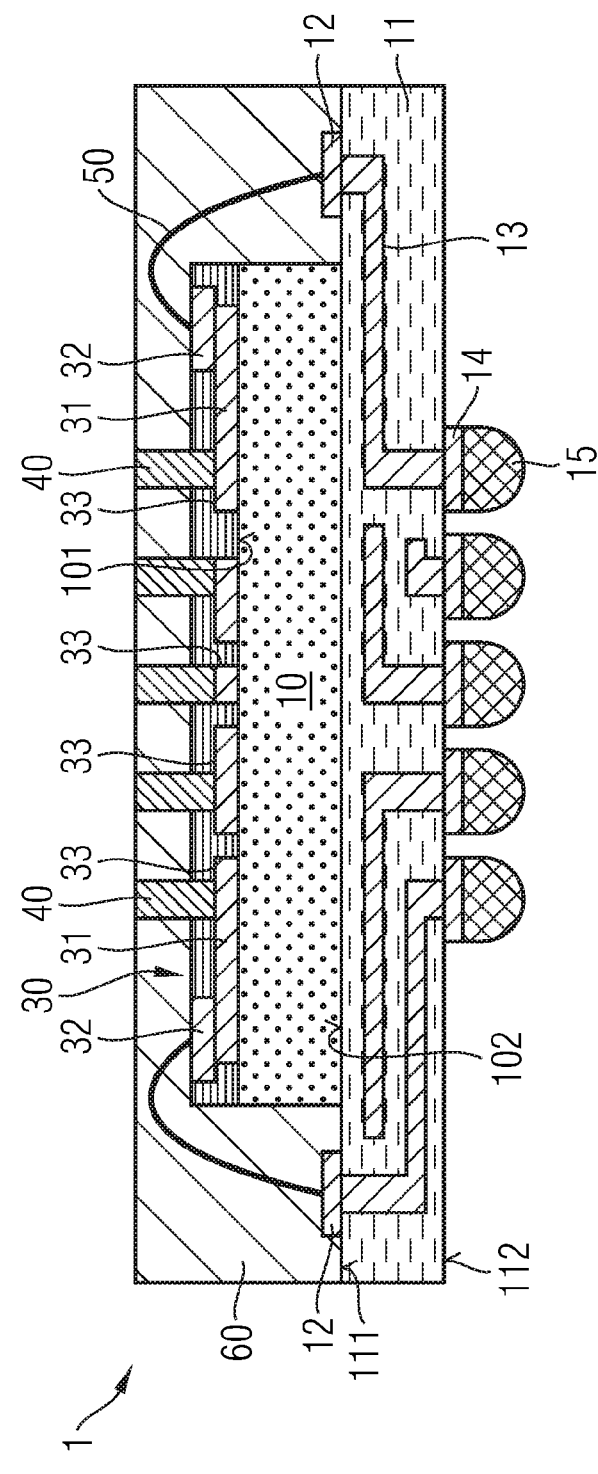
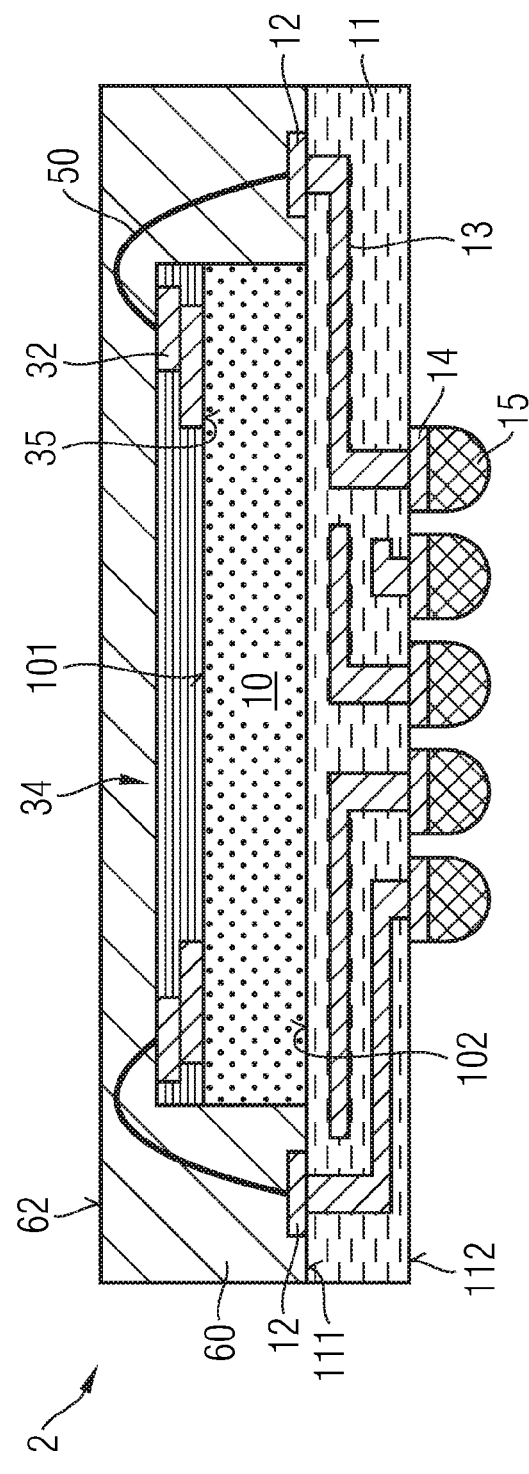

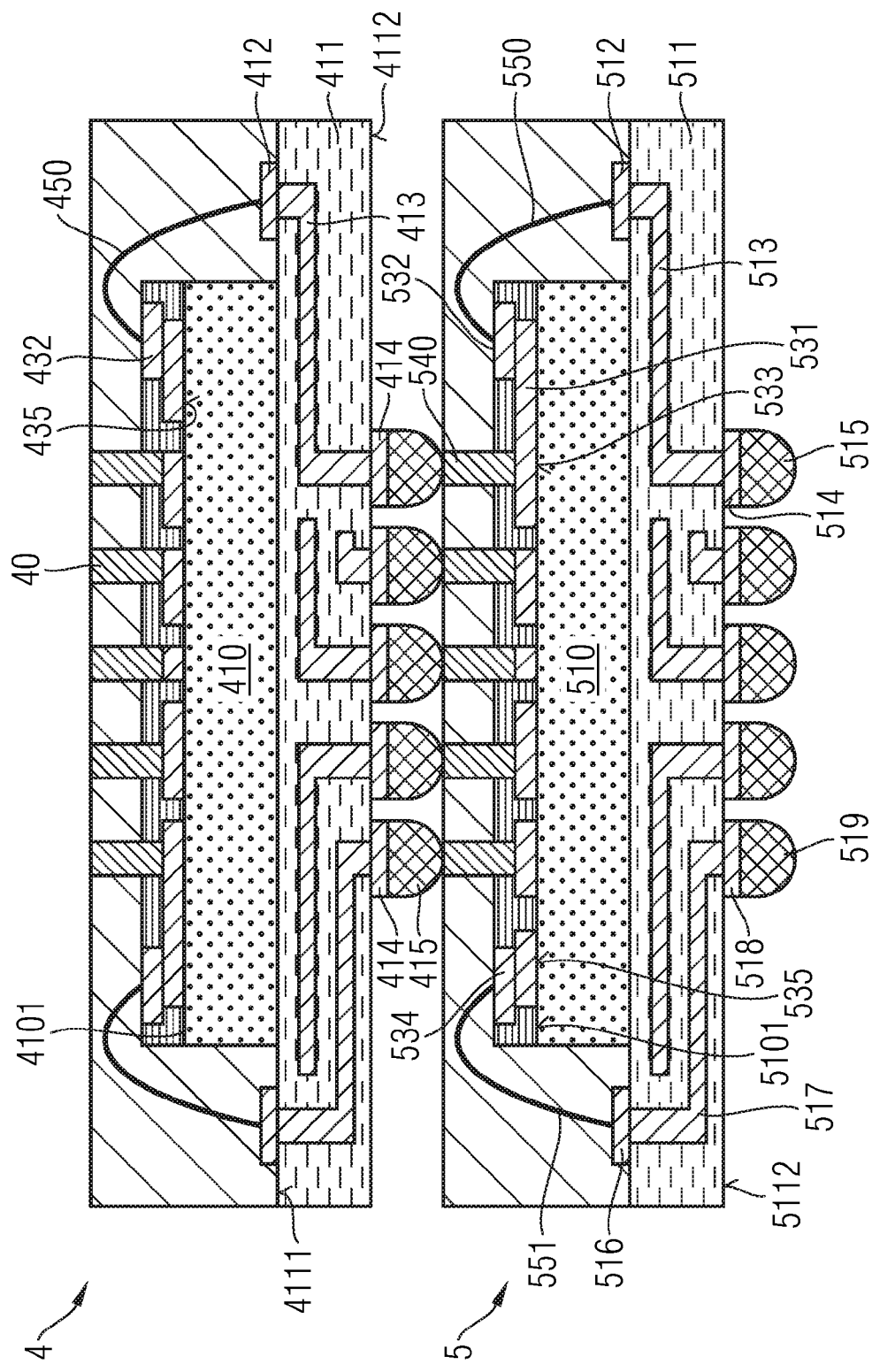

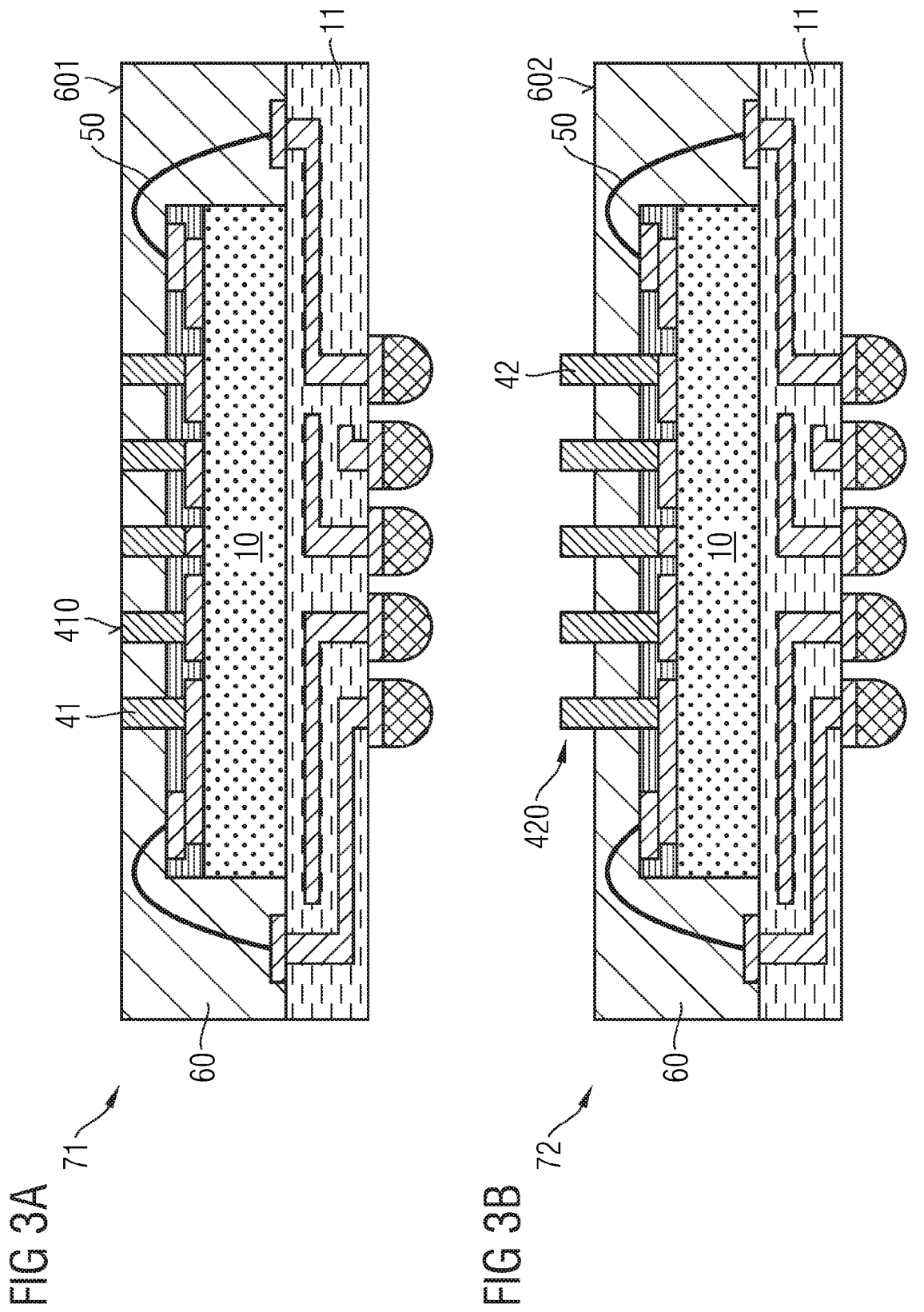

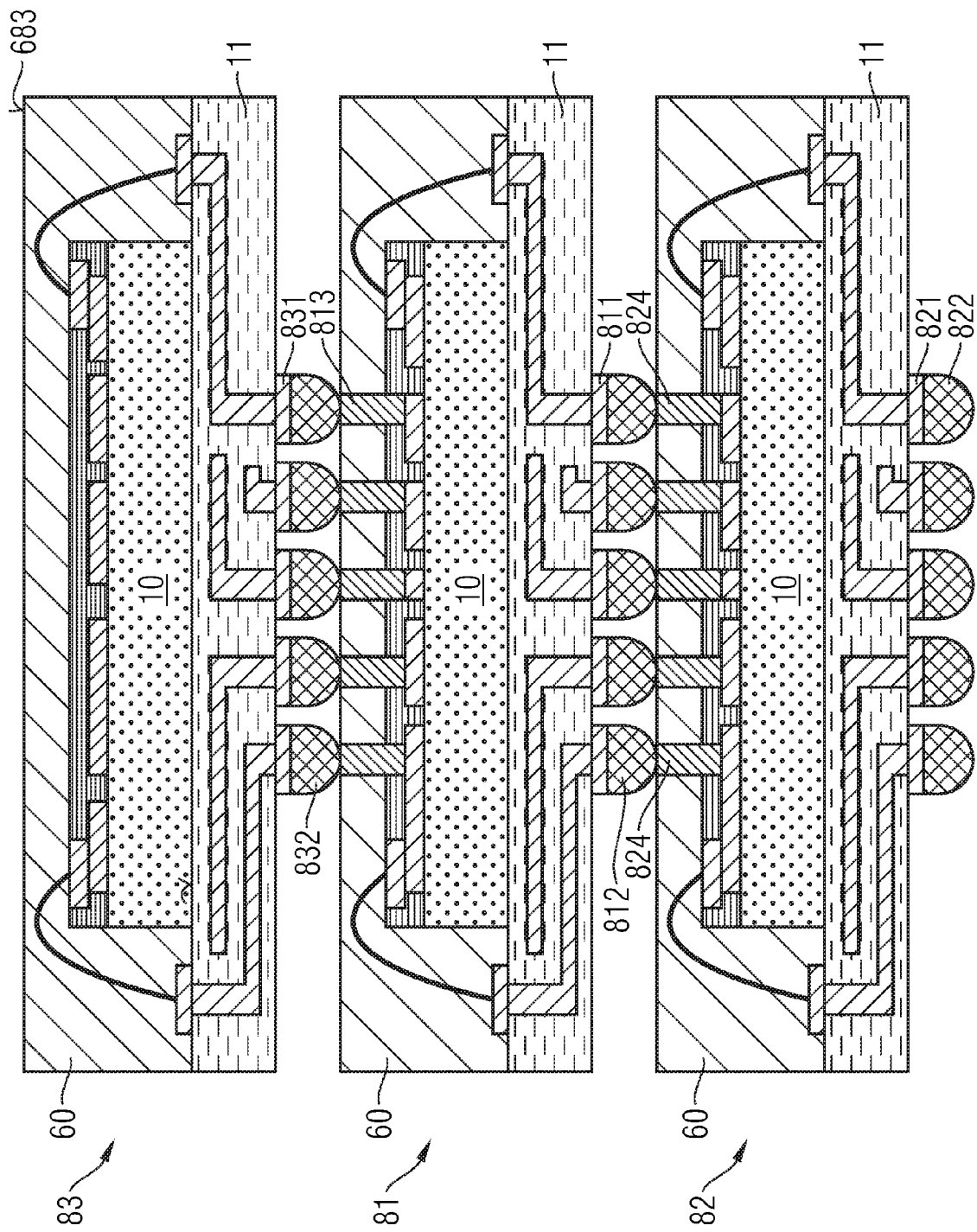

INTEGRATED CIRCUIT AND METHOD

BACKGROUND

Integrated circuits include one or more chips positioned on a substrate. The chips may be stacked. The integrated circuits include other functional elements, e.g., transistors, resistors, capacitors, diodes, etc. The integrated circuit may include other circuits, e.g., processing circuits or logic circuits.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A through 1C illustrate schematic views of integrated circuits according to one or more embodiments.

FIGS. 2A and 2B illustrate schematic views of integrated circuits according to further embodiments.

FIGS. 3A through 3D illustrate schematic views of integrated circuits according to further embodiments.

FIGS. 4A through 4F illustrate schematic views of an integrated circuit in various stages during fabricating according to one embodiment.

DETAILED DESCRIPTION

Figure 1C:
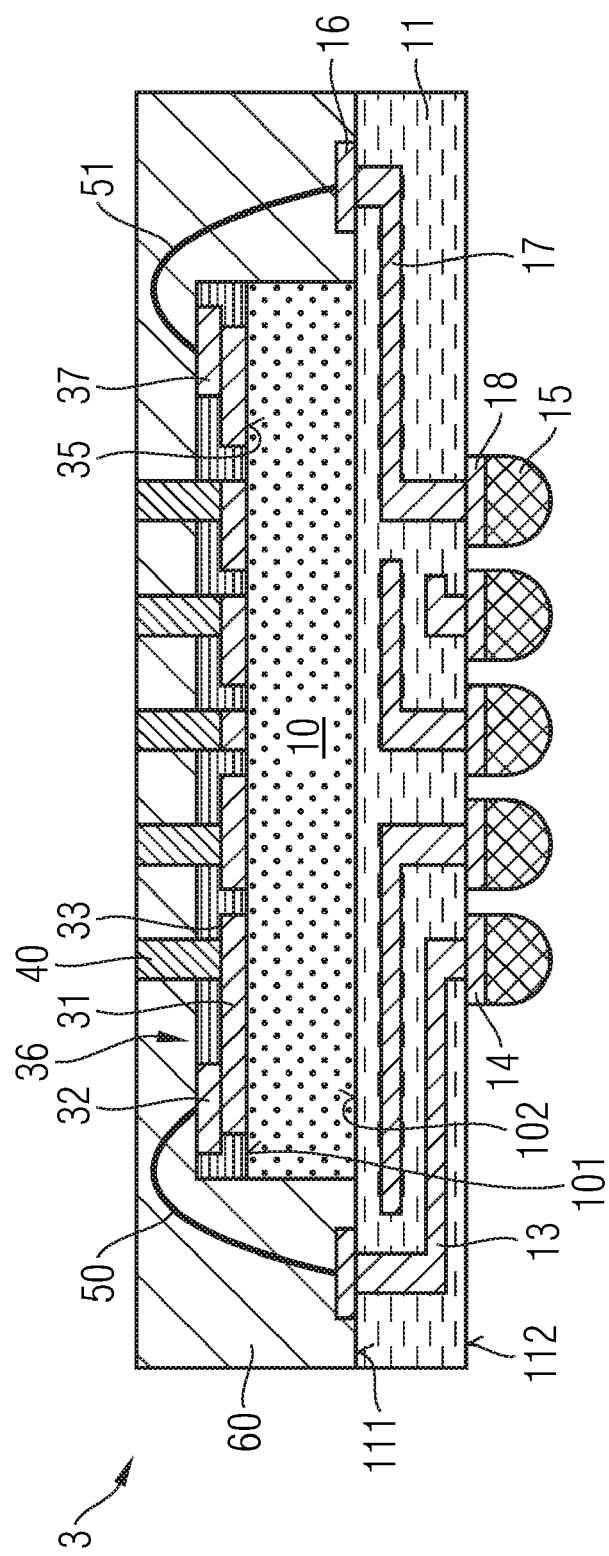

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Various embodiments provide particular advantages for an improved integrated circuit, an improved stack of integrated circuits, and an improved method of fabricating an integrated circuit.

The recited features will become clear from the following description of embodiments, taken in conjunction with the accompanying drawings. It is to be noted, however, that the accompanying drawings illustrate only typical embodiments, and are, therefore, not to be considered limiting of the scope of the invention. The present invention may admit equally effective implementations and/or embodiments.

FIG. 1A illustrates a schematic view of an integrated circuit according to one embodiment. Accordingly, an integrated circuit 1 includes a circuit chip 10, which is arranged on a substrate 11 such that a bottom face 102 of the circuit chip 10 faces a top face 111 of the substrate 11. The circuit chip 10 itself may include one or more circuit substrates, such as semiconductor and/or silicon substrates, which, in turn, may include electronic, optical, and/or other functional elements. These functional elements, as they may be known from the fabrication of highly integrated devices, may include transistors, resistors, conductors, capacitors, inductors, diodes, light emitters, light sensors, lasers, insulators, and related other functional elements.

Furthermore, the circuit chip 10 may include an integrated circuit, such as a memory circuit, a memory cell array, a central processing unit (CPU) circuit, a signal processing circuit, a logic circuit, or any other circuit that may be integrated onto a circuit chip. The circuit chip 10 may furthermore include a stack of two, three, or several chip substrates, which may be identical chip substrates and/or individual chip substrates. Such a chip stack may provide an increased memory capacity, an increased calculating power, or an increased integration of functional elements within the circuit chip 10.

According to one embodiment, there are arranged on a top face 101 of the circuit chip 10 a contact area 33, a signal line 31, and a contact area 32. On the contact area 33 there is arranged a projecting top contact 40, which is accessible from a top face of the integrated circuit 1. A bond wire 50 couples the contact area 32 on the circuit chip 10 to a further contact area 12 on a top face 111 of the substrate 11. The substrate 11 includes a further signal line 13, which couples the contact area 12 to a lower contact pad 14 on a bottom face 112 of the substrate 11. A solder ball 15 may be arranged on the lower contact pad 14 such to allow for a solder connection to another integrated circuit, a circuit board, a printed circuit board, a motherboard, a module board, and/or any other external circuitry. The contact area 33, the signal line 31, the contact area 32, and/or the projecting top contact 40 may be part of a first signal distribution later 30, being arranged on the top face 101 of the circuit chip 10.

According to one embodiment, a continuous connection is established from the projecting top contact 40 to the lower contact pad 14 on the bottom face 112 of the substrate 11, by using the signal line 31, the contact area 32, the bond wire 50, the contact area 12, and the further signal line 13. In this way, a signal may be routed from a top side of the integrated circuit 1 to a bottom side of the integrated circuit 1.

FIG. 1B illustrates an integrated circuit according to another embodiment. Accordingly, an integrated circuit 2 includes elements as they have been described in conjunction with FIG. 1A. According to this embodiment, a second signal distribution layer 34 is arranged on the top face 101 of the circuit chip 10. The second signal distribution layer 34 includes a chip contact 35 which is coupled to the contact area 32.

The chip contact 35 establishes a connection to the circuit chip 10 and/or to the circuit being comprised by the circuit chip 10. The contact area 32 is connected to a contact area 12 on the top face 111 of the substrate 11 with a bond wire 50. The contact area 12 is connected by a further signal line 13 to a lower contact pad 14 on the bottom face 112 of the substrate 11. In this way, a continuous connection from the circuit chip 10 to the lower contact pad 14 is established by using the contact area 32, the bond wire 50, the contact area 12, and the further signal line 13.

The integrated circuit 2, according to this embodiment, may be suitable for being stacked as a top integrated circuit onto a further integrated circuit, as being described in conjunction with one embodiment. The integrated circuit 2 may not include projecting top contacts, therefore, the entire circuit chip 10, in conjunction with the bond wires 50 may be encapsulated by a package mold 60, which may provide a sealed top face 62 of the integrated circuit 2. Since the top face 62 is sealed and closed by the package mold 60, the integrated circuit 2 is suitable for placing it onto the top of a stack of two or more integrated circuits.

FIG. 1C illustrates a schematic view of an integrated circuit according to another embodiment. Accordingly, an integrated circuit 3 includes elements as they have been described in conjunction with FIGS. 1A and/or 1B. According to this embodiment, the integrated circuit 3 includes a first continuous connection from a projecting top contact 40, to a first lower contact pad 14 on the bottom face 112 of the substrate 11. This first connection includes the contact area 33, the signal line 31, the contact area 32, the bond wire 50, the contact area 12 on the top face 111 of the substrate 11, and the further signal line 13. In this way, the first continuous connection provides a connection from the top face of the integrated circuit 3 to a bottom face of the integrated circuit 3.

Furthermore, a second continuous connection from the circuit chip 10 is provided to a second lower contact pad 18 on the bottom face 112 of the substrate 11. The second continuous connection includes a second contact area 37, a second bond wire 51, a second contact area 16 on the top face 111 of the substrate 11, and a second further signal line 17. In this way, the second continuous connection provides a connection from the circuit chip 10 of the integrated circuit 3 to a bottom face of the integrated circuit 3. According to this embodiment, the integrated circuit 3, may be suitable for placing it into a stack of several integrated circuits, as an intermediate integrated circuit or as a bottom integrated circuit.

FIG. 2A illustrates a stack of integrated circuits according to a further embodiment. Accordingly, stack includes a first integrated circuit 4 and a second integrated circuit 5. The stack of the integrated circuits 4, 5 may be part of or may form another integrated circuit, such as an integrated memory device, an integrated computing device, or an integrated central processing device.

The stack of the integrated circuits includes a first continuous connection from a circuit chip 410 of the first integrated circuit 4 to a lower contact pad 514 on a bottom face 5112 of the substrate 511 of the second integrated circuit 5. This first continuous connection couples a chip contact 435 on a top face 4101 of the circuit chip 410 to the lower contact pad 514, and, includes a contact area 432 on the top face 4101 of the circuit chip 410, a bond wire 450, a contact area 412 on a top face 4111 of the substrate 411 of the first integrated circuit 4, the signal line 413 of the substrate 411, a lower contact pad 414 on the bottom face 4112 of the substrate 411 of the first integrated circuit 4, a solder connection 415, a projecting top contact 540 on a top face 5101 of the circuit chip 510 of the second integrated circuit 5, a contact area 533, a signal line 531, a contact area 532, a bond wire 550, a contact area 512, and a signal line 513 of the substrate 511. In this way a continuous connection from the circuit chip 510 of the first integrated device 4 is established via the substrate 411 of the first integrated circuit 4, the top face of the circuit chip 510 of the second integrated circuit 5, and the substrate 511 of the second integrated circuit 5 to a bottom face of the substrate 511.

The second integrated circuit 5 includes a second continuous connection from the circuit chip 510 of the second integrated circuit 5 to a second lower contact pad 518 on the bottom face 5112 of the substrate 511. This second connection includes the circuit contact 535, the contact area 534, the bond wire 551, the contact area 516, the further signal line 517 of the substrate 511. According to one embodiment, the integrated circuits 4, 5 may be stacked onto each other, or be stacked onto further integrated circuits, while the integrated circuits 4, 5 may provide a minimum or reduced height of the resulting circuit stack, reducing the overall space, which is required by the stack on a, for example, a circuit board. In addition to this, the integrated circuits 4, 5 may also allow for a signal routing from each circuit chip of every constituent integrated circuit of a circuit stack to a common bottom face of the circuit stack. Such a common bottom face may be provided by the bottom face of a substrate which is part of a bottom integrated circuit, such as the bottom face 5112 of the substrate 511.

Figure 2B:
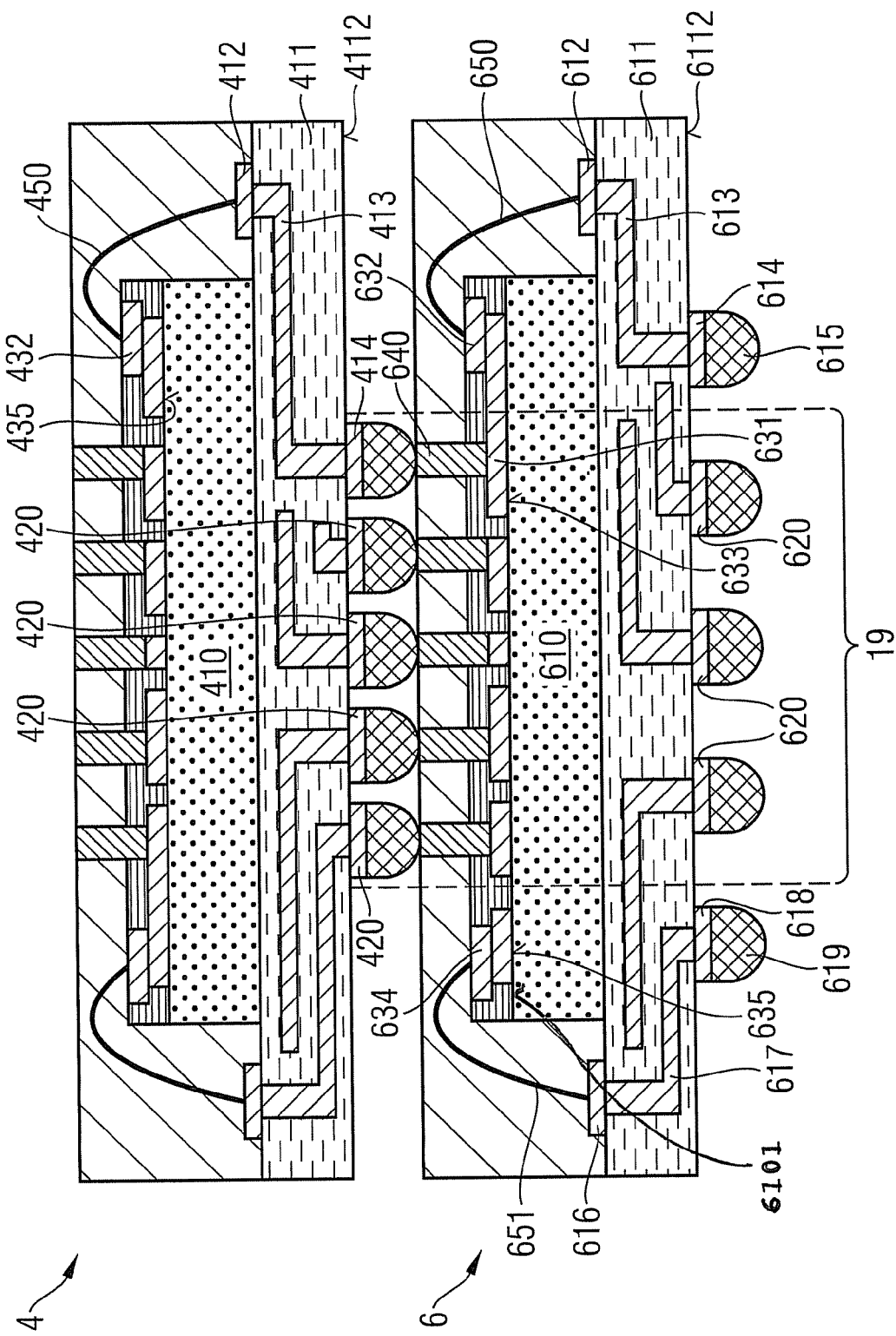

FIG. 2B illustrates a schematic view of a stack of integrated circuits according to another embodiment. Accordingly, a stack includes the integrated circuit 4, as this has been described in conjunction with FIG. 2A, and a further integrated circuit 6. A first continuous connection from the circuit chip 410 of the first integrated circuit 4 to a lower contact pad 614 on a bottom face 6112 of the substrate 611 of the second integrated circuit 6 includes the contact area 432, the bond wire 450, the contact area 412, the signal line 413, the lower contact pad 414, the solder connection 415, a projecting top contact 640 on a top face 6101 of a circuit chip 610 of the second integrated circuit 6, a contact area 633, a signal line 631, a contact area 632, a bond wire 650, a contact area 612, and a signal line 613 of the substrate 611. A second continuous connection from the circuit chip 610 of the further integrated circuit 6 to a second lower contact pad 618 on the bottom face 6112 of the substrate 611 includes a circuit contact 635, a contact area 634, a bond wire 651, a contact area 616, and a further signal line 617 of the substrate 611.

According to one embodiment, the lower contact pad 414 and further lower contact pads 420 on the bottom face 4112 of the substrate 411 are arranged on the bottom face 4112 with a first density of contact pads per area. As illustrated here, a first number of contact pads 414, 420 is arranged within a fraction 19 of the bottom face 4112. A density of contacts, contact pads, or solder balls per area may also be denoted as a pitch. The lower contact pads 614, 620 on the bottom face 6112 of the substrate 611, however, are arranged on the bottom face 6112 with a second density of contact pads per area, the second density being less than the first density. Accordingly a lower number of contact pads 614, 620 is arranged within the corresponding fraction 19 of the bottom face 6112 of the further integrated circuit 6. This lower density may also be denoted as a lower pitch. In this way, different densities and/or pitches of contact pads of the individual integrated circuits may be provided, and allow for, for example, a high density interconnection between the individual integrated circuits on one hand, and a connection with a lower density to an external circuit, for example to a circuit board, on the other hand. Such a connection to an external circuit or to a circuit board may require a lower pitch, since other manufacturing techniques and/or processes may apply to such circuit boards than may apply to the highly integrated substrates of the integrated circuits. For example, circuit boards may be fabricated with substantially reduced requirements to the precision of the process and/or to the purity of involved chemical, gases, and/or environments.

According to one embodiment, the contact pads 414, 420 or 614, 620 may be arranged on respective bottom faces of a substrate in an area under the circuit chip. In such an arrangement, there may be no contact pads outside this area, i.e. the area, where there is no circuit chip above on a top face of the substrate may be devoid of any contact pads. In this way, substrate warpage may be suppressed or reduced, which may be of advantage if two or several integrated circuits are stacked and coupled to each other. In addition to this, the footprint and or area of the integrated circuit may be reduced or minimized, since no space outside the area of the circuit chip may be required for the placement of contacting or interconnecting contact pads.

FIG. 3A illustrates a schematic view of an integrated circuit according to one embodiment. Accordingly, an integrated circuit 721 includes the circuit chip 10 and the substrate 11, as they have been described in conjunction with one embodiment. A package mold material 60 is furthermore arranged on the circuit chip 10 and the substrate 11. According to this embodiment, the package mold 60 provides a top surface 601 on a top face of the integrated circuit 71. The package mold 60 exposes a projecting top contact 41 in an area of a top flat 410 of the projecting top contact 41.

Accordingly, the top surface 601 of the package mold 60 provides a smooth surface in conjunction with the top flat 410 of the projecting top contact 41. In this way, a smooth top surface of the integrated circuit 71 may be provided with a median variation of top surface level below 100 microns, below 10 microns, or below 1 micron. Furthermore, the package mold 60 may surround the bond wire 50, the projecting top contact 41 extending above a maximum height of the bond wire 50, such that the bond wire 50 is completely encapsuled by the package mold 60, whereas the package mold 60 still exposes at least the top flat 410 of the projecting top contact 41.

FIG. 3B illustrates a schematic view of an integrated circuit according to one embodiment. Accordingly an integrated circuit 72 includes the circuit chip 10 on the substrate 11. According to this embodiment, the package mold 60 provides a top face 602, which exposes projecting top contacts 42, such that a top section 420 of the projecting top contacts 42 extends above the top face 602. The top sections 420 may extend more than 1 micron, more than 10 microns, or more than 100 microns above the top face 602. The projecting and extending top sections 420 of the projecting top contacts 42 may provide an increased effective contact surface of the projecting top contacts 42, such to allow for a reliable and reproducible contacting of the projecting top contacts 42, by using, for example, a solder ball or a solder connection of or to a further integrated circuit.

Figure 3C:
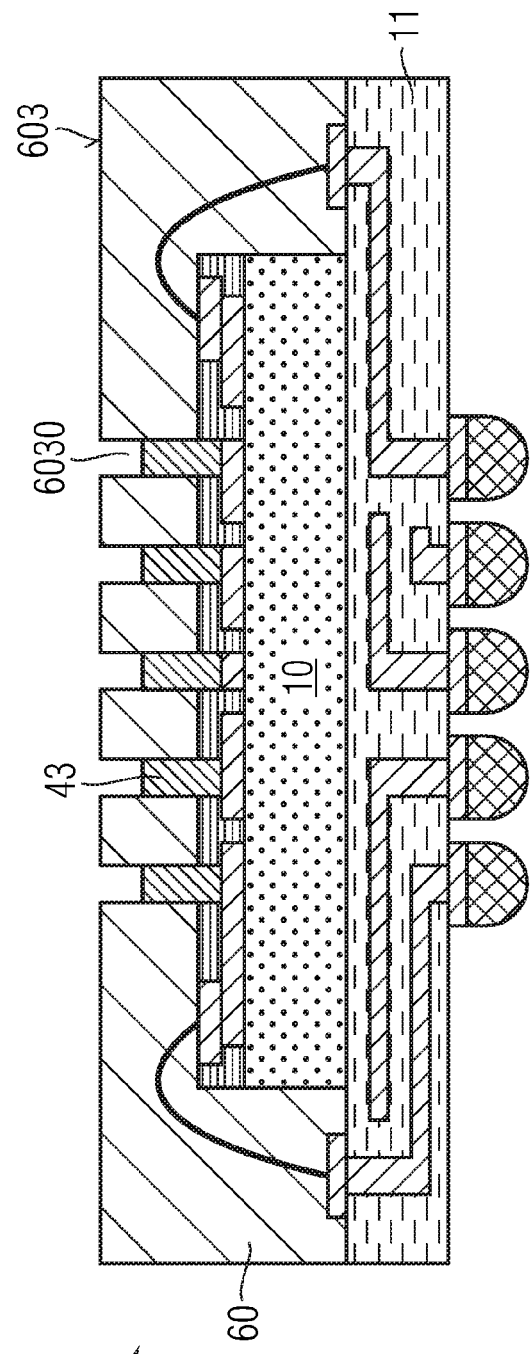

FIG. 3C illustrates a schematic view of an integrated circuit according to one embodiment. An integrated circuit 73 includes the circuit chip 10 on the substrate 11. According to this embodiment, the package mold 60 provides a top surface 603, and seals off parts of the circuit chip 10 and the substrate 11. Furthermore, the package mold 60 exposes projecting top contacts 43 and provides cavities 6030 in the top face 603, which are arranged in the area of the projecting top contacts 43. In this way, the formation of a connection to the projecting top contacts 43 may be guided or enhanced, by using, for example, a guiding of a liquid solder material toward the respective projecting top contact 43 within the cavity 6030.

Figure 3D:
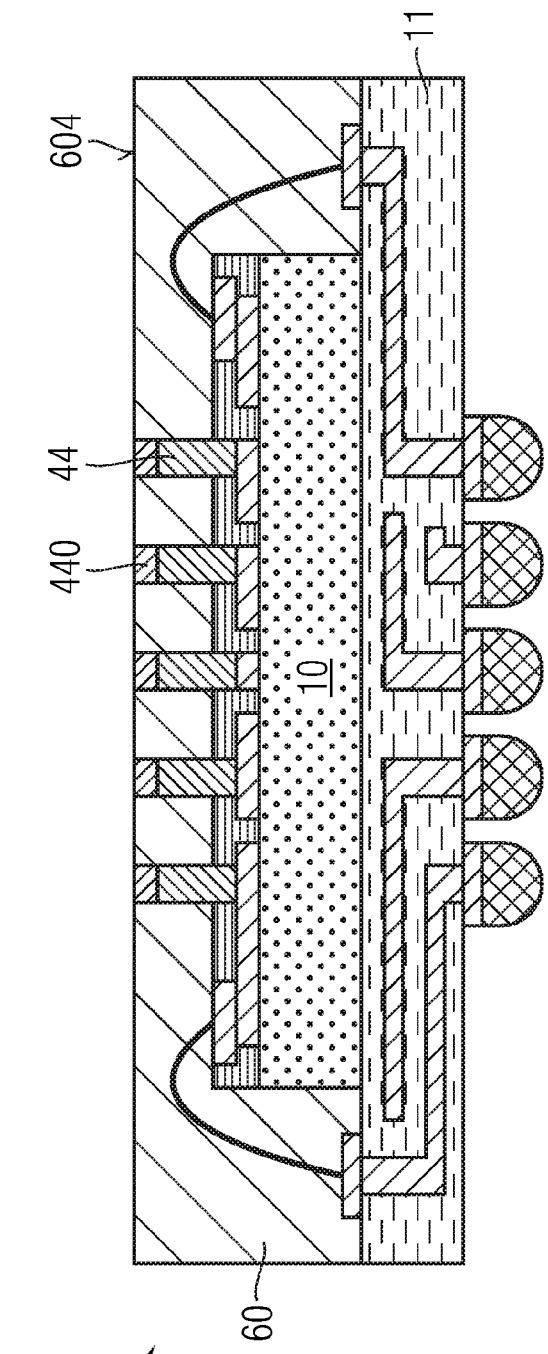

FIG. 3D illustrates a schematic view of an integrated circuit according to one embodiment. An integrated circuit 74 includes the circuit chip 10 on a substrate 11, and a package mold 60, which, in turn, provides a top surface 604 of the integrated circuit 74. According to this embodiment, a top cap 440 is arranged on a top section of the projecting top contact 44. Such a top cap 440 may cover only a top flat of the projecting top contact 44 and/or also a side face of the top section of the projecting top contact 44. The top cap 440 may include any top cap of the group of a tin cap, a tin-silver cap, a gold cap, nickel cap, a nickel-gold cap, an organic surface protection cap (OSP), and an organic material cap.

In this way, a top section of the projecting top contact 44 may be protected for enhancing an establishment of a contact to the projecting top contact 44 by using, for example, a solder connection. Reliable and reproducible solder connections may require an inhibiting of an oxidation of the material of the projecting top contact 44. In this way, a reproducible and reliable interconnection of more than one integrated circuit may be provided whilst allowing for a reduction of a reject rade, since, for example, interconnections or solder connections to the projecting top contacts 44 may be established in a reliable and reproducible way.

The top surface 604 may be such as described in conjunction with a previous embodiment, i.e., may provide a smooth surface together with the top cap 440 or top flats of the projecting top contacts 44, may provide a cavity in the area of the top cap 40 and/or the projecting top contact 44, or may expose the top cap 440 and/or further parts or the entire projecting top contact 44 such that the top cap 440 and/or a top section of the projecting top contact 44 extends above the top surface 604.

According to one or more embodiments, a contact may be established to a top face of a circuit chip which is coupled to a substrate or a carrier by using a bond wire. Such a bond wire may be bonded to a corresponding contact area, which is also arranged on the top face of the circuit chip. The projecting top contact may bridge the top distance to the circuit chip such to avoid a contact or an interference to the bond wire, which may necessarily extend above the top face of the circuit chip.

Figure 4A:
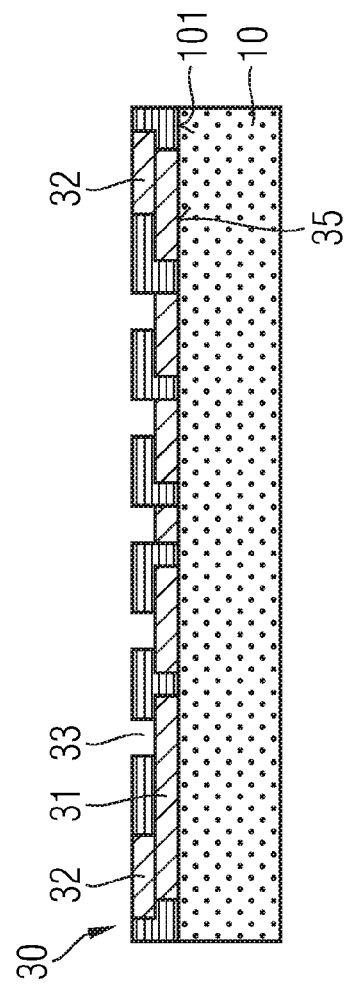

FIGS. 4A through 4F illustrate schematic views of an integrated circuit in various stages during fabricating, according to yet another embodiment. As illustrated in FIG. 4A, the circuit chip 10 is provided, including the contact areas 32, the signal lines 31, and the contact areas 33 on the top face 101 of the circuit chip 10. The contact area 32, the signal line 31, the contact area 33, and/or other contact areas and signal lines may be comprised by the signal distribution layer 30, which may form or include a redistribution layer (RDL). The signal distribution layer 30 may, in turn, include additional materials, such as insulating materials and/or layers, such to allow for an insulation of facing or neighboring signal lines 31, contact areas 33, and/or contact areas 32. Furthermore, the signal distribution layer 30 may include more than one signal routing layer, such to allow for signal line and path crossings without a short connection and/or interference among them.

Figure 4B:
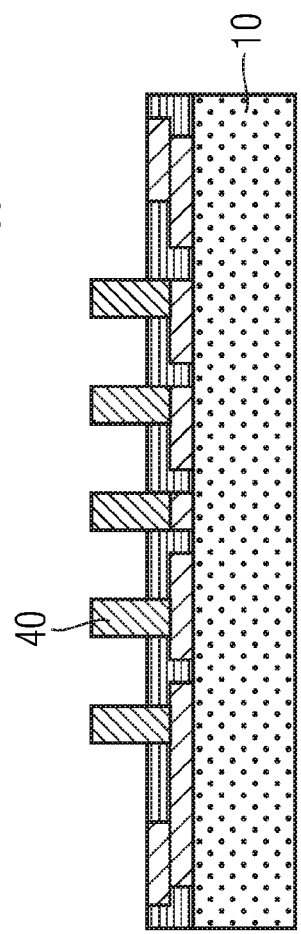

As illustrated in FIG. 4B, the projecting top contacts 40 are provided on the top face 101 of the circuit chip 10. The projecting top contacts 40 may be provided such to be in contact with the contact areas 33. The projecting top contacts 40 may include any of the group of a metal pillar, a copper pillar, a stud bump, a solder ball, and a bond wire stud. Accordingly, the provision of the projecting top contact 40 may include an electric and/or electroless plating or an electrochemical provision of a metal pillar on the contact area 33, a liquid fill technique such to provide the projecting top contact 40 on the contact area 33, a liquid deposition technique such to allow for a provision of a portion of a liquid metal on the contact area 33, which, after solidification, provides a solid projecting top contact 40, or a bonding of a bond wire to the contact area 33, the bond wire being cut such to provide a projecting top contact 40.

Figure 4C:
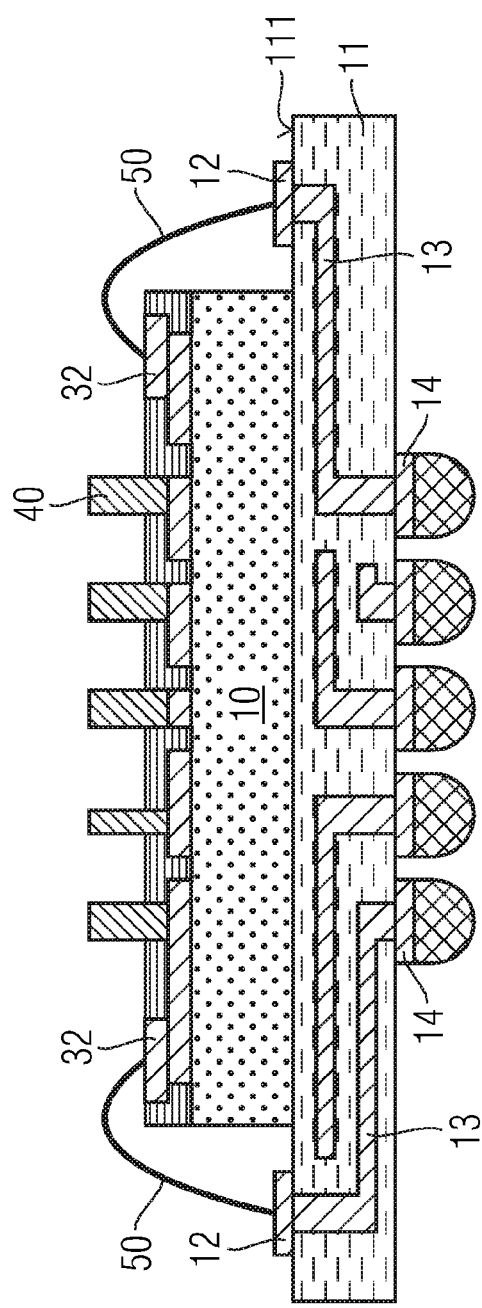

As illustrated in FIG. 4C, the circuit chip 10 is arranged on the top face 111 of the substrate 11. The circuit chip 10 is connected to the substrate 11, by using the bond wires 50, which connect the contact areas 32 on the circuit chip 10 to the contact areas 12, which are arranged, in turn, on the top face 111 of the substrate 11. The provision of the bond wires 50 may be such that a maximum height of the bond wires 50 above the top face 111 of the substrate 11 may be lower than a top section of the projecting top contacts 40. In this way, the projecting top contacts 40 may be contacted to other entities, such as a second integrated circuit, whilst avoiding any contact, damage, interference, or bending of the bond wires 50. In this way, projecting or bridging elements on other entities may be rendered obsolete and/or an overall stacking height of the entire circuit stack may be reduced and/or minimized. The circuit chip 10 may be attached to the substrate 11 by using an adhesive material, such as a epoxy resin or a tape.

Figure 4D:
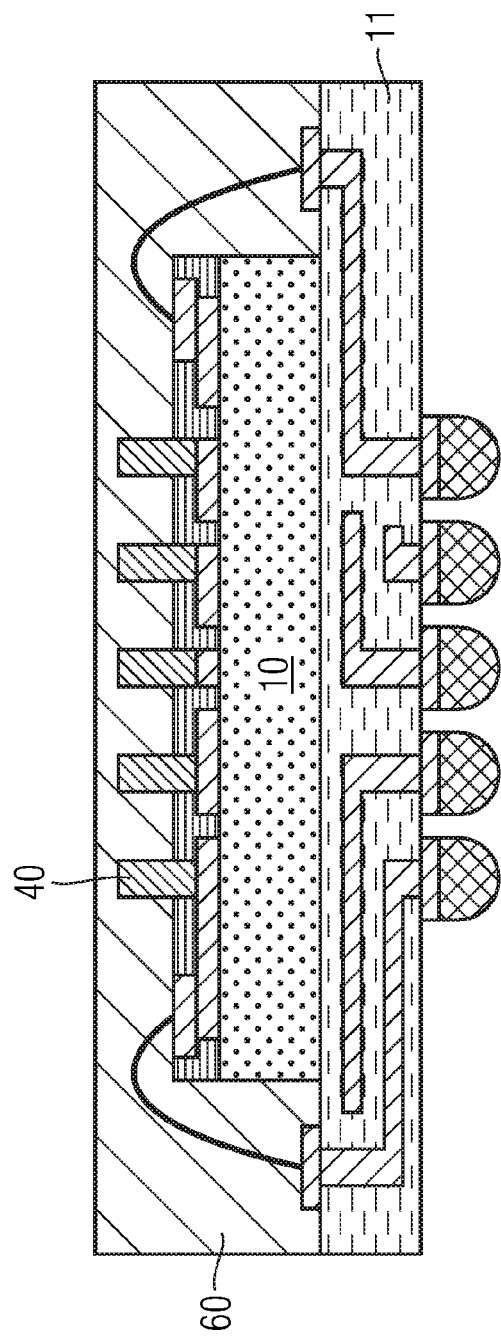
Figure 4E:
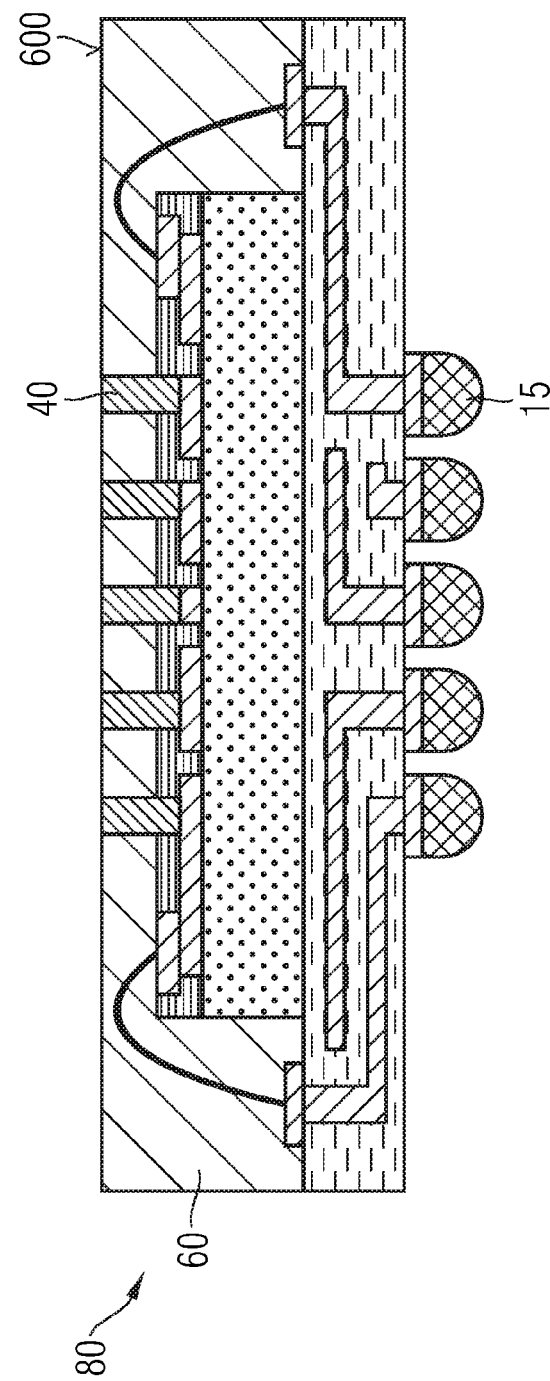

As illustrated in FIG. 4D, a package mold 60 is provided on the circuit chip 10 and the substrate 11. The package mold 60 may be provided such that the projecting top contacts 40 are covered by the package mold material 60. In this case, a package mold 60 and parts of the projecting top contacts 40 may be reduced in height, for example by using grinding, chemical mechanical polishing, or polishing processes, such as to expose parts of the projecting top contacts 40 on a top face 600 of the package mold 60 and/or to provide a smooth or uniform surface quality of the top face 600, as illustrated in FIG. 4E.

Nevertheless, the package mold 60 may be provided such to initially provide a common surface 600 with the projecting top contacts 40, exposing a top section of the projecting top contacts 40 in the area of a cavity of the package mold 60, or exposing a projecting top section of the projecting top contacts 40, as described in conjunction with one embodiment, without the need of a reduction of the height, a grinding, or a polishing process of the package mold 60. In this way, an integrated circuit 80 is provided, which may furthermore include solder balls 15, solder paste layers, and/or a layer of a solder stop material, such to be suitable for a connection to a circuit board, a connection to a further integrated circuit, or for a stacking in conjunction with several individual integrated circuits.

As illustrated in FIG. 4F, a first integrated circuit 81 and a second integrated circuit 82 are stacked onto each other. The first and second integrated circuits 81, 82 may be manufactured as has been described in conjunction with the integrated circuit 80 in FIGS. 4A through 4E. An interconnection of the first integrated circuit 81 to the second integrated circuit 82 may be established by using a solder connection 812, coupling a lower contact pad 811 of the first integrated circuit 81 to a projecting top contact 824 of the second integrated circuit 82. In this way, a continuous connection from the circuit chip 10 of the first integrated circuit 81, or from a top face of the circuit chip 10 of the first integrated circuit 81, may be routed to a lower contact pad 821 on the substrate 11 of the second integrated circuit 82. Furthermore, a continuous connection of the circuit chip 10 of the second integrated circuit 82 may be routed to a lower contact pad 821 on the substrate 11 of the second integrated circuit 82. The establishing of the continuous connections may be such as described in conjunction with one embodiment.

According to one embodiment, a further integrated circuit 83 may be stacked on top of the stack of the first integrated circuit 81 and the second integrated circuit 82. Accordingly, the further integrated circuit 83 may provide a sealed top surface 683 of a package mold 60, hence covering the circuit chip 10 of the further integrated circuit 83 and providing a sealed off and stable top face of the entire circuit stack. In addition to this, the further integrated circuit 83 may be provided without projecting top contacts, since the further integrated circuit 83 is suitable for forming the top integrated circuit of a stack of several integrated circuits.

Nevertheless, a continuous connection from the circuit chip 10 of the further integrated circuit 83 may be formed to a lower contact pad 821 on the substrate 11 of the second integrated circuit 82, by using routing the signal through the substrate 11 of the further integrated circuit 83, a projecting top contact 813 on the circuit chip 10 of the first integrated circuit 81, a surface of the circuit chip 10 of the first integrated circuit 81, the substrate 11 of the first integrated circuit 81, a projecting top contact 824 on the circuit chip 10 of the second integrated circuit 82, a surface of the circuit chip 10 of the second integrated circuit 82, and the substrate 11 of the second integrated circuit 82.

According to further embodiments, the provision of solder contacts on a substrate outside the chip area may be avoided, this, in turn, may reduce substrate warpage and the reject rate of integrated circuits during fabrication. Also, a package size and/or a foot print of the integrated circuit may be reduced, and/or a number of input/output ports (IO count) may be increased. In this way, a high grade utilization of the substrate may be provided, due to a reduced package size. This may apply compared to a normal chip scale package (CSP). In a corresponding way, several chip scale packages with the same scale and/or pitch may be stacked and connected to each other. Furthermore, the package stack height may already be reduced for a stack including only two integrated circuits and/or packages.

According to yet further embodiments, a circuit chip may be or include a flip chip, which is intended to be placed with its top face onto the top face of a substrate or a carrier. Here, however, such a flip chip may be arranged with its bottom face on the top face of the substrate, such that its top face remains accessible and may be contacted to other substrates or chips, and such that a bond wire may be attached to a pad on its top face. Furthermore, a high flexibility may be provided to cover various ball or bump layouts of the upper circuit, by changing the layout of the projecting top contacts.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a circuit chip having a top face and a bottom face;
   a substrate having a top face and an opposing bottom face, wherein the bottom face of the circuit chip is arranged on the top face of the substrate;
   a contact pad arranged on the top face of the circuit chip;
   a projecting top contact arranged on the top face of the circuit chip and extending vertically from the top face of the circuit chip as a pillar and extending to a top face of the integrated circuit such that the pillar is accessible at the top face of the integrated circuit;
   a signal line arranged on the top face of the circuit chip and mechanically coupling the contact pad directly to the projecting top contact;
   a lower contact pad arranged on the bottom face of the substrate and a bottom face of the integrated circuit; and
   a connection coupling the contact pad to the lower contact pad;

wherein a continuous connection is provided from the top face of the integrated circuit to the bottom face of the integrated circuit by virtue of the projecting top contact contacting a top surface of the signal line, a top surface of the signal line contacting a bottom surface of the contact pad, and the contact pad coupled to the lower contact pad by the continuous connection.

2. The integrated circuit of claim 1, further comprising:
a second contact pad on the top face of the circuit chip;
a second lower contact pad on the bottom face of the substrate; and
a second connection coupled to the second contact pad and to the second lower contact pad.

3. The integrated circuit of claim 1, the projecting top contact comprising a metal pillar.

4. The integrated circuit of claim 3, the projecting top contact comprising a top cap being arranged on the top of the projecting top contact and any top cap of a group consisting of a tin cap, a tin-silver cap, a gold cap, a nickel cap, a nickel-gold cap, an organic surface protection cap, and an organic material cap.

5. The integrated circuit of claim 1, the connection comprising:
a further contact pad arranged on the top face of the substrate;
a bond wire coupled to the contact pad on the top face of the circuit chip and the further contact pad, wherein the projecting top contact extends above the bond wire; and
a further signal line arranged in the substrate, the further signal line coupling the further contact pad to the lower contact pad.

6. The integrated circuit of claim 1, wherein the lower contact pad is arranged on the bottom face of the substrate in an area under the circuit chip.

7. The integrated circuit of claim 6, wherein a solder ball is arranged on the lower contact pad.

8. The integrated circuit of claim 1, further comprising:
a signal distribution layer on the top face of the circuit chip, the signal distribution layer comprising the signal line.

9. The integrated circuit of claim 1, further comprising:
a package mold, the package mold comprising a planar top surface and exposing a top flat of the projecting top contact, the top flat being even with the top planar surface.

10. The integrated circuit of claim 1, further comprising:
a package mold, the package mold comprising a cavity in the area of a top section of the projecting top contact and exposing the top section of the projecting top contact.

11. The integrated circuit of claim 1, further comprising:
a package mold, a top section of the projecting top contact extending above a top surface of the package mold.

12. The integrated circuit of claim 1, comprising:
a further arrangement of a second circuit chip and a second substrate, the further arrangement being stacked on the circuit chip and the substrate, and a further lower contact pad on a bottom face of the substrate of the further arrangement being coupled to the projecting top contact on the circuit chip.

13. The integrated circuit of claim 1, wherein the substrate includes a stack of a plurality of individual chip substrates.

14. An integrated circuit comprising:
a first circuit chip having a first circuit chip top face and an opposing first circuit chip bottom face;
a first substrate having a first substrate top face and an opposing first substrate bottom face, wherein the first circuit chip bottom face is arranged on the first substrate top face;
a first lower contact pad on the first substrate bottom face;
a second circuit chip having a second circuit chip top face and an opposing second circuit chip bottom face wherein the first substrate bottom face is stacked on the second circuit chip top face;
a projecting top contact on the second circuit chip top face and extending vertically from the second circuit chip top face as a pillar and extending to a top face of the integrated circuit such that the pillar is accessible at the integrated circuit top face, wherein the projecting top contact is coupled to the first lower contact pad forming a first connection configured to pass a signal from the first lower contact pad to the projecting top contact;
a second contact pad on the second circuit chip top face;
a signal line arranged on the second circuit chip top face and mechanically coupling the second contact pad directly to the projecting top contact
a second substrate having a second substrate top face and an opposing second substrate bottom face, wherein the second circuit chip bottom face is arranged on the second substrate top face; and
a second lower contact pad on the second substrate bottom face wherein the second contact pad is coupled to the second lower contact pad forming a second connection configured to pass the signal from the second contact pad to the second lower contact pad at a bottom face of the integrated circuit;
wherein a continuous connection is provided from the top face of the integrated circuit to the bottom face of the integrated circuit by virtue of the projecting top contact contacting a top surface of the signal line, a top surface of the signal line contacting a bottom surface of the second contact pad, and the second contact pad coupled to the second lower contact pad by the continuous connection.

15. The integrated circuit of claim 14, comprising a solder connection coupling the projecting contact pad to the first lower contact pad.

16. The integrated circuit of claim 14, wherein the first lower contact pad is part of a first contact pad array, wherein the second lower contact pad is part of a second contact pad array, and wherein the first contact pad array provides a higher density of pads per area than the second contact pad array.

17. The integrated circuit of claim 16, wherein the first lower contact pad is arranged on the first substrate bottom face in an area under the first circuit chip and the remainder of the first substrate bottom face outside the area under the first circuit chip being devoid of contact pads.

18. The integrated circuit of claim 14, wherein a first package mold is arranged on the first circuit chip and the first substrate, a second package mold is arranged on the second circuit chip and the second substrate, and the second package mold is exposing a top section of the projecting top contact.

19. The integrated circuit of claim 18, wherein a solder ball is arranged on the projecting top contact.

20. The integrated circuit of claim 14, wherein the first circuit chip and the second circuit chip include stacks of individual chips, wherein each individual chip includes a memory circuit.

21. A semiconductor package including an integrated circuit comprising:
a circuit chip having a top face and a bottom face;
a substrate having a top face and an opposing bottom face, wherein the bottom face of the circuit chip is arranged on the top face of the substrate;
a contact pad arranged on the top face of the circuit chip;

a projecting top contact arranged on the top face of the circuit chip and extending vertically from the top face of the circuit chip as a pillar and extending to a top face of the integrated circuit such that the pillar is accessible at the top face of the integrated circuit;

a signal line arranged on the top face of the circuit chip and mechanically coupling the contact pad directly to the projecting top contact;

a lower contact pad arranged on the bottom face of the substrate and a bottom face of the integrated circuit;

a connection coupling the contact pad on the circuit chip to the lower contact pad such that the connection, the contact pad and the signal line are configured to pass a signal from the projecting top contact and the lower contact pad; and a mold material at least partially surrounding the circuit chip;

wherein a continuous connection is provided from the top face of the integrated circuit to the bottom face of the integrated circuit by virtue of the projecting top contact contacting a top surface of the signal line, a top surface of the signal line contacting a bottom surface of the contact pad, and the contact pad coupled to the lower contact pad by the continuous connection.

* * * * *